United States Patent [19]
Doi et al.

[11] Patent Number: 5,502,029
[45] Date of Patent: Mar. 26, 1996

[54] LAMINATED SUPER CONDUCTOR OXIDE WITH STRONTIUM, CALCIUM, COPPER AND AT LEAST ONE OF THALLIUM, LEAD, AND BISMUTH

[75] Inventors: Toshiya Doi, Hitachi; Atsuko Soeta, Mito; Seizi Takeuchi, Hitachiota; Tomoichi Kamo, Ibaraki; Shinpei Matsuda, Tokyo, all of Japan

[73] Assignee: Hitachi, Ltd., Tokyo, Japan

[21] Appl. No.: 186,545

[22] Filed: Jan. 26, 1994

[30] Foreign Application Priority Data

Jan. 27, 1993 [JP] Japan .................................... 5-011730

[51] Int. Cl.$^6$ .......................... H01B 12/02; H01L 39/12; C04B 35/453; C01F 11/04
[52] U.S. Cl. .......................... 505/234; 505/120; 505/121; 505/125; 505/126; 505/782; 505/783; 505/784; 505/238; 501/123; 252/521; 428/688; 428/689; 428/701; 428/702; 428/930
[58] Field of Search .................................... 505/120, 121, 505/125, 126, 782, 783, 784, 234, 238; 501/123, 152; 252/521; 428/688, 689, 701, 702, 930

[56] References Cited

U.S. PATENT DOCUMENTS

| | | | |
|---|---|---|---|
| 4,894,361 | 1/1990 | Subramanian | 505/120 |
| 5,028,585 | 7/1991 | Spencer | 505/785 X |
| 5,049,541 | 9/1991 | Uzumaki et al. | 505/782 X |
| 5,087,605 | 2/1992 | Hegde et al. | 505/1 |
| 5,096,882 | 3/1992 | Kato et al. | 505/725 X |
| 5,149,687 | 9/1992 | Galasso | 505/783 X |
| 5,262,393 | 11/1993 | Wada et al. | 505/783 X |
| 5,264,413 | 11/1993 | Bozovic et al. | 505/782 X |
| 5,264,414 | 11/1993 | Subramanian | 505/783 X |
| 5,300,482 | 4/1994 | Doi et al. | 505/783 X |
| 5,318,948 | 6/1994 | Okada et al. | 505/785 X |
| 5,342,828 | 8/1994 | Kountz et al. | 505/783 X |
| 5,428,005 | 6/1995 | Matsuura et al. | 505/234 |

FOREIGN PATENT DOCUMENTS

| | | |
|---|---|---|
| 0511734 | 11/1992 | European Pat. Off. . |
| 4300202 | 10/1992 | Japan . |
| 5000816 | 1/1993 | Japan . |
| 5136470 | 6/1993 | Japan . |
| 90 04856 | 5/1990 | WIPO . |

OTHER PUBLICATIONS

Physica C, vol. 200, 1992, Amsterdam NL, pp. 403–408, M. Inoue, et al.
Applied Physics Letters, vol. 54, No. 16, 17 Apr. 1989, pp. 1582–1584, Mimura, et al.
Physical Review Letters, vol. 69, No. 18, 2 Nov. 1992, pp. 2713–2716, Qi Li.
Physica C, vol. 183, 1991, Amsterdam NL, pp. 67–72.

Mao, S. N., et al., "Superconducting $Y_1Ba_2Cu_3O_{y-x}/Nd_{1.85}Ce_{0.15}CuO_{4-y}$ bilayer thin films", *Appl. Phys. Lett.*, 62 (19) (10 May 1993), 2425–7.
Horiuchi, Ken, et al., "$Bi_2Sr_2Ca_1Cu_2O_8/Bi_2Sr_2Sr_2Cu_1O_6$ Superlattices: Modulation of the Number of $CuO_2$ Plane between $Bi_2O_2$ Layers", *Japanese Journal of Applied Physics*, 30 (8A, part 2) (Aug. 1991), L1381–L1383.
Kawashima, Syunichiro, et al., "Superlattice Structure of $TlBa_2Ca_2Cu_3O_y$ and $Tl_2Ba_2Ca_2Cu_3O_y$ (c/2)", *Japanese Journal of Applied Physics*, 29, (6, part 2) (Jun. 1990), L900–L901.
Kuroda, Ken'ichi, et al., "Superconductivity of Bi System Thin Films Formed by Consecutively Sputtering Three Pb–Doped Targets of Slightly Different Compositions", *Japanese Journal of Applied Physics*, 29 (2, part 2) (Feb. 1990), L291–L293.
Bulaevskii, L. N., et al., "Fluctuations of Vortices in Layered High-Tc Superconductors", *Physical Review Letters*, 68 (25) (22 Jun. 1992), 3773–6.
Chemical Abstracts acc. No. 122:327895, Mexner, W., et al., "Critical Currents and Activation Energies of Tl–223 and TlPb–1223 high temperature superconductors", *Proc. Int. Workshop Crit. Curr. Superond.*, 7th (1994), 513–6.
Chemical Abstracts, acc. No. 117:182123, Goodman P., et al., "Symmetry determination and lead-site ordering analysis for the n=1, 2, lead bismuth strontium calcium cooper oxide compounds by convergent–beam and selected–area electron diffraction", *Acta Crystallogr., Sect. B: Struct. Sci.*, 1992, B48(4), 376–89.
Solidstate, acc. No. 89:3138, Martin, C., et al., "Structural perculiarities of the '1212' Superconductor", *Physica C*, 157 (3) (1989), 460–8.
Doi, Toshiya, et al., *Mat. Res. Soc. Symp. Proc.*, 235 (Phase Formation and Modification by Beam–Solid Interactions) (1992), 653–8.
Doi, Toshiya, et al., *Physica C*, 183 (1–3) (1991), 67–72.
Chemical Abstracts, CA 116:185476, Chou, H., et al., *Mod. Phys. Lett. B.*, 5 (26) (1991), 1735–43.
Manako, T., et al., *Physica C*, 156 (1988), 315–8.

*Primary Examiner*—Douglas J. McGinty
*Attorney, Agent, or Firm*—Antonelli, Terry, Stout & Kraus

[57] ABSTRACT

Superconductors using oxide superconducting materials having pinning centers inside crystal grains are enhanced in transmissible critical current density and allowed to have a high critical current density even in the magnetic field. A superconductor is produced comprising superconducting materials having a high irreversible magnetic field where the c axes of their crystals are oriented in one direction. This can be practically realized by heat-treating a superconducting material having the composition $(Tl_{1-x1-x2}Pb_{x1}Bi_{x2})(Sr_{1-x3}Ba_{x3})_2Ca_2 Cu_3O_{9+x4}$ together with $Bi_2Sr_2CaCu_2O_8$ having a tendency of growing in the form of plate crystal. Various apparatuses capable of working under cooling with liquid nitrogen let alone with liquid helium and having a high superconducting critical current density even in a high magnetic field can be produced.

7 Claims, 6 Drawing Sheets

LAMINATED SUPER CONDUCTOR OXIDE WITH STRONTIUM, CALCIUM, COPPER AND AT LEAST ONE OF THALLIUM, LEAD, AND BISMUTH

BACKGROUND OF THE INVENTION

1. Field of the Invention

The present invention relates to an oxide based superconducting material capable of exhibiting a superconductive property when cooled with liquid helium or liquid nitrogen, a superconductor capable of transmitting a superconducting current under cooled condition with liquid helium or liquid nitrogen, a process for the production thereof, and a superconducting wire, superconducting coil, and magnetic shield substance comprising the superconducting material.

2. Description of Related Art

Conventional high temperature oxide based superconducting containing Tl, Sr, Ca, Cu, and O as major elements have a superconducting critical temperature as high as about 120 K. as reported in Physica C vol. 183, pp. 67–72; Proceedings, Vol. 235, Materials Research Society Symposium, Boston, Dec. 1st–6th, 1991; Japanese Patent KOKAI (Laid-open) No. Hei 4-300202; and Japanese Patent KOKAI (Laid-open) No. Hei 5-816. Although they are very promising materials which could have succeeded in the introduction of pinning centers thereinto, i.e., the prerequisite for achieving a high critical current density, they are difficult to retain such a high critical current density as transmission current when formed into superconducting wires as well as to make into practical products, through which an actual superconducting current can be passed.

Satisfactory consideration has not been given heretofore to the electrical connections between the crystal particles of superconducting material present in the conventional superconducting wires, i.e., the connections of grain boundaries, across which a sufficient superconducting current can be passed. Therefore, there has been a problem that the critical current density is drastically reduced only by applying a slight magnetic field to the superconducting materials.

SUMMARY OF THE INVENTION

An object of the present invention is to provide a superconductor comprising a high temperature oxide base superconducting material which can exhibit a higher critical current density even in a magnetic field by improving the electrical connection between the crystal grains of superconducting material present in the superconductor.

DETAILED DESCRIPTION OF PREFERRED EMBODIMENTS

Figure 1:
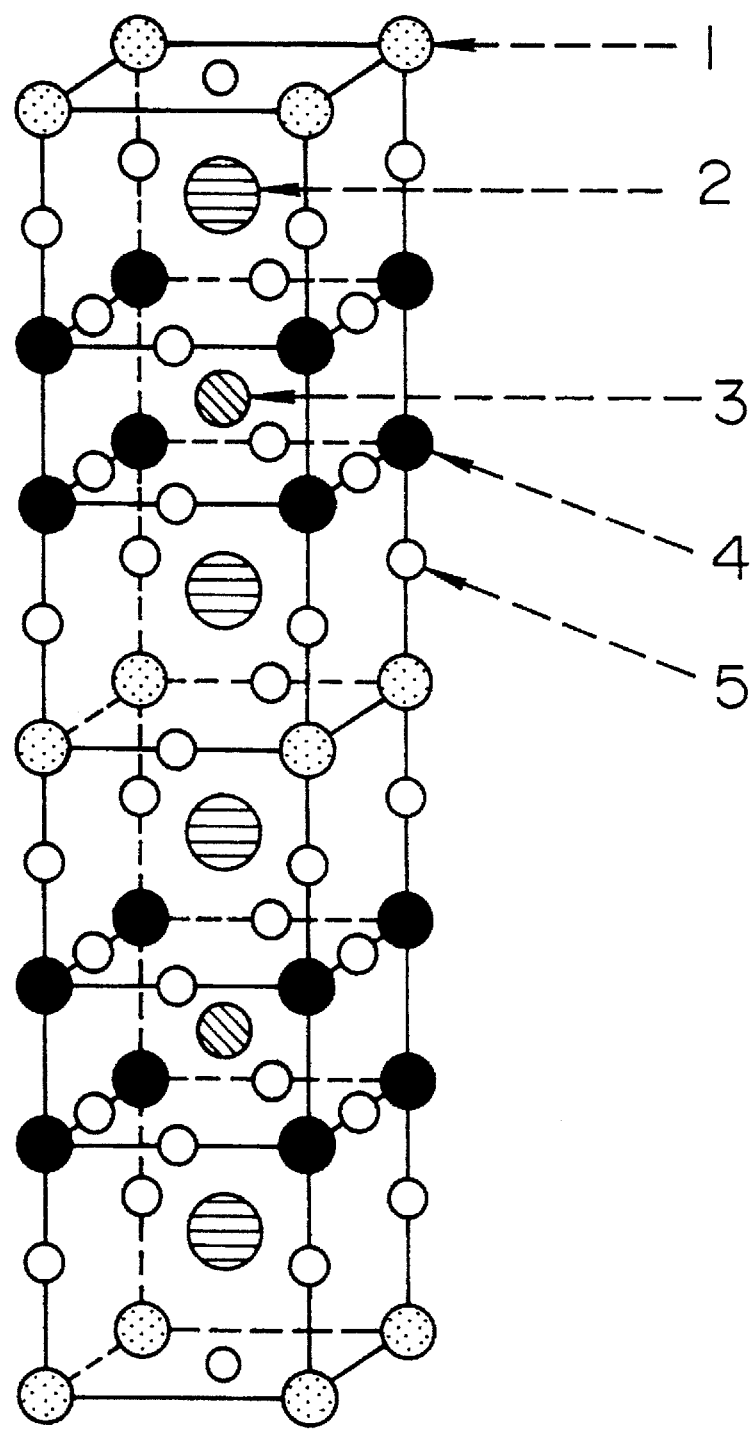
FIG. 1 shows the crystalline structure obtained in Example 1.

In order to achieve the aforementioned objects, as a first aspect of the present invention, there is provided a superconductor comprising at least both a non-superconducting material or superconducting material capable of growing in the form of plate crystal and a superconducting material capable of retaining a superconductive state at a temperature of 77 K. or higher.

In the second aspect of the present invention, the superconductor may comprise elements, each having a structure of a laminate of the non-superconducting material or superconducting material and the other superconducting material, where approximately 80% of the elements may be laminated in the direction at an angle of 90° to the direction of passing a superconducting current.

In the third aspect of the present invention, the superconductor may comprise at least both a superconducting material containing component elements of Tl, Sr, Ca, Cu and O and a superconducting material containing component elements of Bi, Sr, Ca, Cu and O.

In the fourth aspect of the present invention, the superconductor may comprise at least both a superconducting material containing component elements of Tl, Ba, Ca, Cu and O and a superconducting material containing component elements of Bi, Sr, Ca, Cu and O.

In the fifth aspect of the present invention, the superconductor may comprise at least both a superconducting material having a chemical composition expressed by Composition 1:

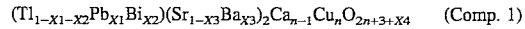
$$(Tl_{1-X1-X2}Pb_{X1}Bi_{X2})(Sr_{1-X3}Ba_{X3})_2Ca_{n-1}Cu_nO_{2n+3+X4} \quad \text{(Comp. 1)}$$

where
n=2, 3, 4, 5, or 6,
$0 \leq X1 \leq 0.8$
$0 \leq X2 \leq 0.5$
$0 \leq X1+X2 \leq 1$,
$0 \leq X3 \leq 1$,
$-0.5 \leq X4 \; 0.5$, and a superconducting material having a chemical composition expressed by Composition 2:

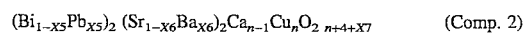
$$(Bi_{1-X5}Pb_{X5})_2(Sr_{1-X6}Ba_{X6})_2Ca_{n-1}Cu_nO_{2\,n+4+X7} \quad \text{(Comp. 2)}$$

where
n=1, 2, or 3,
$0 \leq X5 \leq 0.8$
$0 \leq X6 \leq 0.2$
$-0.5 \leq X7 \leq 0.5$.

In the sixth aspect of the present invention, the superconductor may comprise at least both a superconducting material having a chemical composition expressed by Composition 3:

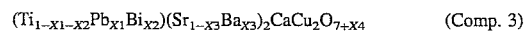
$$(Tl_{1-X1-X2}Pb_{X1}Bi_{X2})(Sr_{1-X3}Ba_{X3})_2CaCu_2O_{7+X4} \quad \text{(Comp. 3)}$$

where
$0 \leq X1 \leq 0.8$
$0 \leq X2 \leq 0.5$
$0 \leq X1+X2 \leq 1$,
$0 \leq X3 \leq 1$,
$-0.5 \leq X4 \leq 0.5$,
and a superconducting material having a chemical composition expressed by Composition 4:

$$(Bi_{1-X5}Pb_{X5})_2(Sr_{1-X6}Ba_{X6})_2CaCu_2O_{3+X7} \quad \text{(Comp. 4)}$$

where $0 \leq X5 \leq 0.8$ $0 \leq X6 \leq 0.2$ $-0.5 \leq X7 \leq 0.5$.

In the seventh aspect of the present invention, the superconductor may comprise at least both a superconducting material having a chemical composition expressed by Composition 5:

$$(Tl_{1-X1-X2}Pb_{X1}Bi_{X2})(Sr_{1-X3}Ba_{X3})_2Ca_2Cu_3O_{9+X4} \quad \text{(Comp. 5)}$$

where $0 \leq X1 \leq 0.8$ $0 \leq X2 \leq 0.5$ $0 \leq X1+X2 \leq 1$, $0 \leq X3 \leq 1$, $-0.5 \leq X4 \leq 0.5$, and a superconducting material having a chemical composition expressed by Composition 6:

$$(Bi_{1-X5}Pb_{X5})_2(Sr_{1-X6}Ba_{X6})_2CaCu_2O_{8+X7} \quad \text{(Comp. 6)}$$

where $0 \leq X5 \leq 0.8$ $0 \leq X6 \leq 0.2$ $-0.5 \leq X7 \leq 0.5$.

In the eighth aspect of the present invention, the superconductor may comprise at least both a superconducting material having a chemical composition expressed by Composition 7:

$$(Tl_{1-X1-X2}Pb_{X1}Bi_{X2})(Sr_{1-X3}Ba_{X3})_2Ca_3Cu_4O_{11+X4} \quad \text{(Comp. 7)}$$

where $0 \leq X1 \leq 0.8$ $0 \leq X2 \leq 0.5$ $0 \leq X1+X2 \leq 1$, $-0.5 \leq X4 \leq 0.5$, and a superconducting material having a chemical composition expressed by Composition 8:

$$(Bi_{1-X5}Pb_{X5})_2(Sr_{1-X6}Ba_{X6})_2CaCu_2O_{8+X7} \quad \text{(Comp. 8)}$$

where $0 \leq X5 \leq 0.8$ $0 \leq X6 \leq 0.2$ $-0.5 \leq X7 \leq 0.5$.

In the ninth aspect of the present invention, the superconductor according to any one of the fifth to seventh aspects may further be under the conditions that the superconducting material comprises component elements with X3=0 and X6=0.

In the tenth aspect of the present invention, the superconductor according to any one of the fifth to eighth aspects may further be under the conditions that the superconducting material comprises elements, each having a structure of a laminate of two types of the superconducting materials alternatingly stratified on top of one another and that approximately 80% of the elements may be laminated in the direction at an angle of 90° to the direction of passing a superconducting current.

In the eleventh aspect of the present invention, the superconductor according to the ninth aspect may comprise the superconducting materials laminated each having a thickness of no less than 5 nm, but no more than 5 μm.

In the twelfth aspect of the present invention, the superconductor may comprise at least both a superconducting material having an irreversible magnetic field at 77 K. of higher than one tesla and a superconducting material having that of less than 0.7 tesla.

In the thirteenth aspect of the present invention, there is provided a process for producing a superconductor comprising the steps of mixing the crystalline particles of a superconducting material or non-superconducting material having an aspect ratio of 10 or more with the largest dimension being not less than 10 μm and a superconducting material having an irreversible magnetic field of higher than one tesla at 77 K. or its precursor, forming the mixture into a desired shape, and heat-treating the shape.

In the fourteenth aspect of the present invention, there is provided a superconducting wire comprising any one of the superconducting materials according to the aspects as described above.

In the fifteenth aspect of the present invention, there is provided a magnet comprising any one of the superconducting materials according to the aspects as described above.

In the sixteenth aspect of the present invention, there are provided a NMR apparatus, MRI apparatus, magnetically leviated train, power generating apparatus, energy storage apparatus, magnetic shield device, radiation generating synchrotron, magnetic separator, and elementary particle accelerator which are constituted with any one of the superconducting materials according to the aspects as described above.

According to the present invention, the superconducting material having an higher irreversible magnetic field than the magnetic field required at a temperature of no lower than 77 K. with the c axes of the crystals of the superconducting material being oriented in a predetermined direction is produced by growing the superconducting material in the manner that the plane thereof grows along the surface of a non-superconducting or superconducting material having a property of growing in the form of plate crystal allowing the resulting composite to orient in a specific direction.

In this case the non-superconducting material or superconducting material having a property of growing in the form of plate crystal should be preferably such that they become superconductive at a desired temperature for allowing the superconductor to work. However, they may be non-superconducting materials so long as they have a property of growing in the form of plate crystal and a higher irreversible magnetic field than the magnetic field required at a temperature of no lower than 77 K., which properties must not be impaired during the heat-treatment of the superconductor.

Practical examples of the material having a property of growing in the form of plate crystal are those which can be expressed by the Composition 2. These materials are superconductive with Tc=30 K. or lower when n =2, or 3, while they are non-superconductive with Tc exceeding 77 K., the boiling point of liquid nitrogen, when n =2, or 3.

The superconducting materials having a higher irreversible magnetic field than the magnetic field required at a temperature of 77 K. or higher include conceivably various oxide superconducting materials. Among them, specifically those synthesized with Tl, Sr, Ca, Cu, and O being base elements are preferred since they have a higher Tc and a higher irreversible magnetic field Hc. The superconducting materials of this group are so versatile that their crystal sites are highly susceptible to substitution with elements. They are practically those materials as expressed by the formula, Composition 1.

Practical examples of the material having a property of growing in the form of plate crystal are those materials as expressed by the formula, Composition 2. These materials have a very low Tc of not higher than 30 K. when n=1, while they have a Tc exceeding 77 K., the boiling temperature of liquid nitrogen, when n=2, or 3. They contain the component elements, the proportions of which are very close to those in the Composition 1, the superconducting material having a higher irreversible magnetic field than the magnetic field required at 77 K. or higher, as described above, so that a combination of both types is very preferred. Among the combinations, most preferred is a combination with X3=0 and X6=0, because undesirable crystalline phases are difficult to produce.

Figure 2:
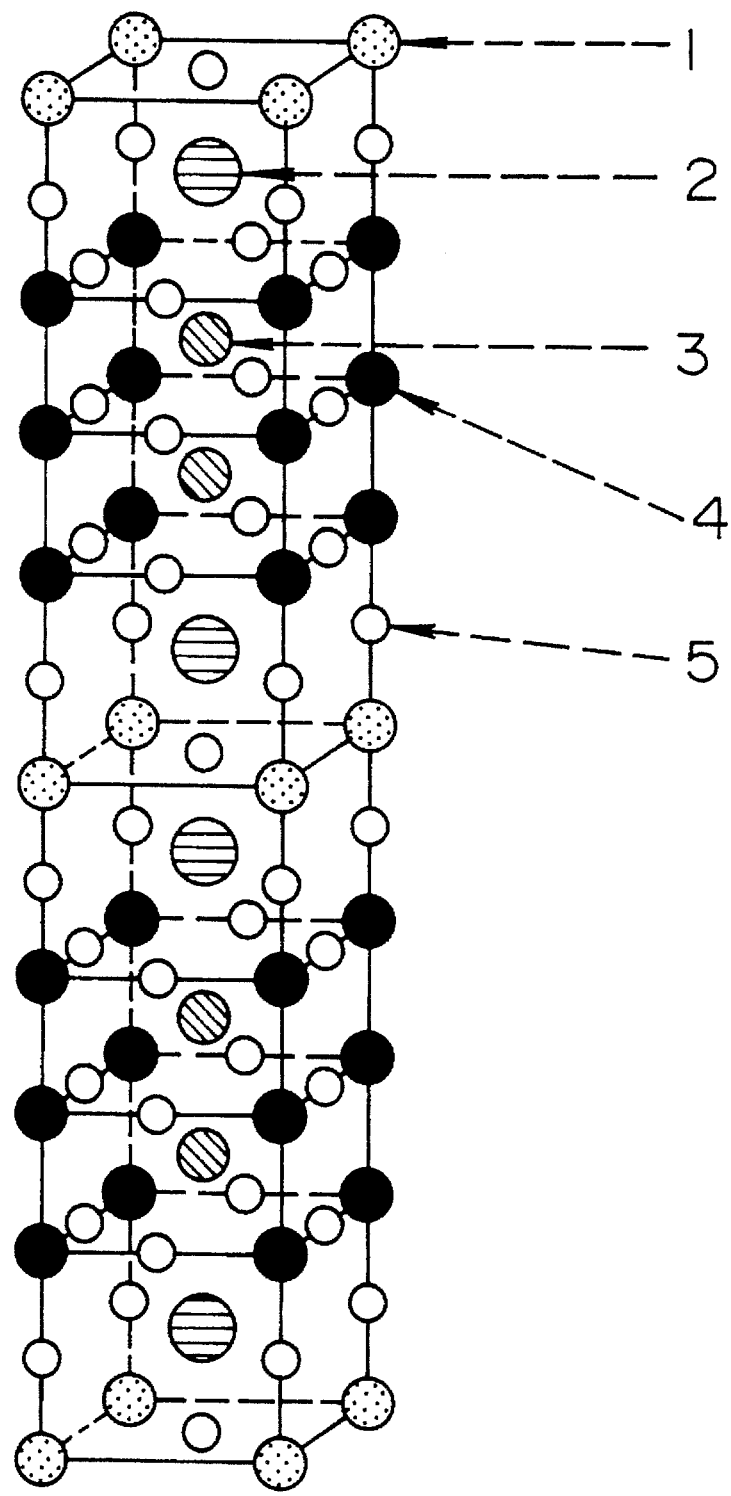
FIG. 2 shows the crystalline structure obtained in Example 2.
Figure 3:
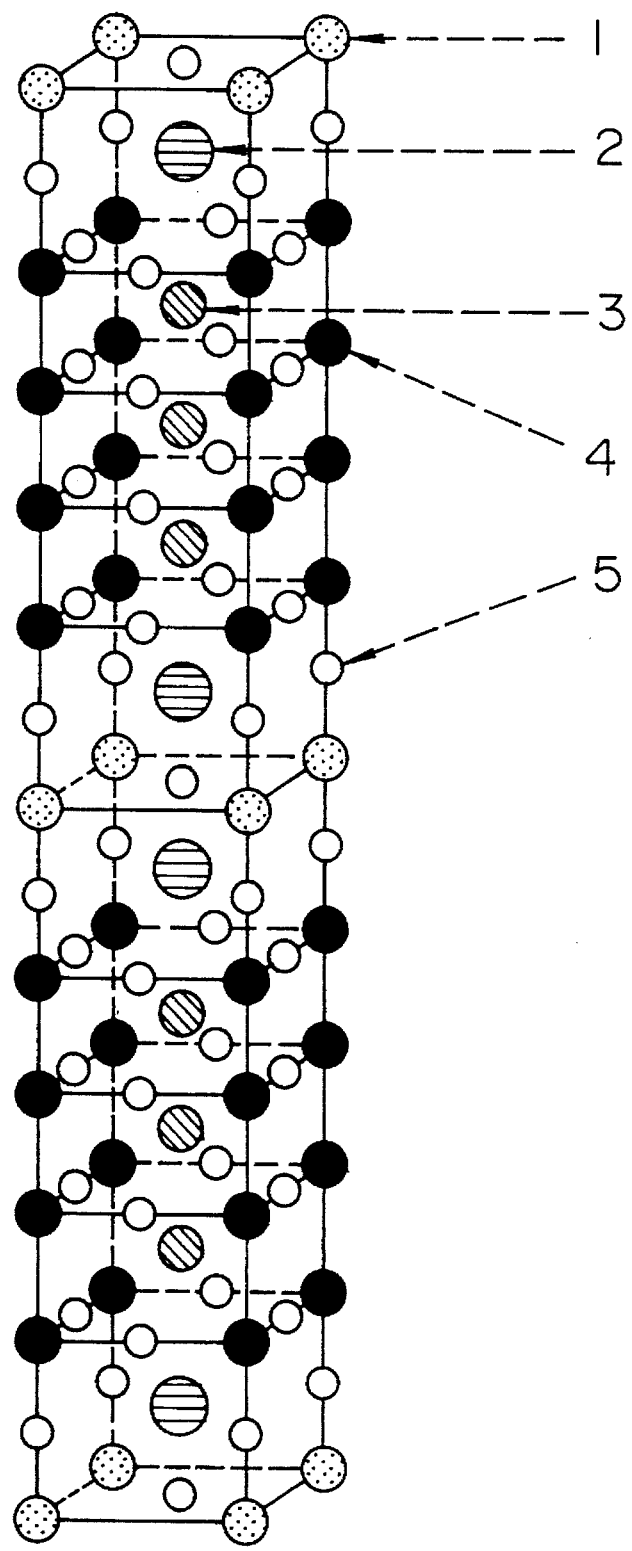
FIG. 3 shows the crystalline structure obtained in Example 3.

According to the present invention, it is evidenced that the superconducting materials having the crystalline structures as shown in FIGS. 1, 2 and 3 can have a high irreversible magnetic field. The term "a irreversible magnetic field" refers to the maximum magnetic field which can be applied to a sample with a flow of superconducting current being allowed to pass therethrough at zero electric resistance at a certain temperature, and if a magnetic field over the maximum magnetic field is applied to the sample, a resistance is produced therein. In the course of production of superconductors having a high irreversible magnetic field by introducing pinning centers into the superconducting materials, in case superconducting wires are to be made from polycrystalline materials (superconducting materials not consisting of single crystal, but having crystal grain boundaries) using superconducting materials capable of enhancing the irreversible magnetic field, the c axes of the crystals of the superconducting materials should be oriented in the same direction to produce a superconductor having a higher Jc. When superconducting wires are produced by a powder-in-tube technique with a powder of crystals grown in the form of plate having a higher anisotropy, the crystals included in the wires are liable to orient in a specific direction. In this case, if the aspect ratio (the ratio of the largest dimension to the shortest dimension) of the crystals is not larger than 10, such orientation effect is not remarkably observed, while it is over 10, the orientation is facilitated.

On the other hand, high temperature superconducting materials contain generally a number of component elements and the velocity of crystal growth of the superconducting materials are not so high. Therefore, they are characterized by having a tendency of growing along the surfaces of plate crystals which are present adjacent them. For this reason, superconducting materials having a high irreversible magnetic field can be made to grow along the surfaces of the crystals liable to grow in the plate form, thereby producing superconducting elements. Since the elements have a large aspect ratio, they can be oriented to cause the orientation of the superconducting crystals having a high irreversible magnetic field, whereby a superconductor having a high Jc even in the magnetic field can be produced. The compositions of the superconducting materials, non-superconducting materials and other materials are not strictly limited to those expressed by the formulae indicated in the present specification. Acturly these oxides may have somewhat varying compositions, for example, the proportion of each component element in an oxide may deviate from the defined composition by several tens to thirty percent. Therefore, even when any one of the compositions of the produced materials described in this specification are somewhat different from the defined composition, both can be safely said the same with each other so long as their crystalline structures are essentially the same.

The present invention will be illustrated with reference to the following Examples.

EXAMPLE 1

As starting materials, $Tl_2O_3$, $Bi_2O_3$, SrO, CaO, CuO, PbO, and BaO which are of a purity of 99% or more were used at first according to the Composition 1 with n=2 to produce a superconducting material of the Composition 3:

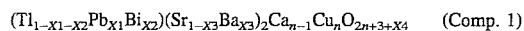
$$(Tl_{1-X1-X2}Pb_{X1}Bi_{X2})(Sr_{1-X3}Ba_{X3})_2Ca_{n-1}Cu_nO_{2n+3+X4} \quad \text{(Comp. 1)}$$

where n=2, 3, 4, 5, or 6, $0 \leq X1 \leq 0.8$ $0 \leq X2 \leq 0.5$ $0 \leq X1+X2 \leq 1$, $0 \leq X3 \leq 1$, $-0.5 \leq X4 \leq 0.5$;

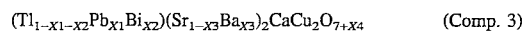
$$(Tl_{1-X1-X2}Pb_{X1}Bi_{X2})(Sr_{1-X3}Ba_{X3})_2CaCu_2O_{7+X4} \quad \text{(Comp. 3)}$$

where $0 \leq X1 \leq 0.8$ $0 \leq X2 \leq 0.5$ $0 \leq X1+X2 \leq 1$, $0 \leq X3 \leq 1$, $-0.5 \leq X4 \leq 0.5$, The conditions of X1=0, X2=0, X3=0, and X4 in the range of not zero were employed where X4 is a factor having no influence on the mechanical properties and crystalline structure of the superconducting material. SrO, CaO and CuO were mixed to achieve an atomic ratio of Sr:Ca:Cu=2:1:2, and fired at 900° C. for 20 hours in air. This powder was ground with an agate morter and pestle, and to the resultant powder, $Tl_2O_3$ was added to achieve an atomic ratio of Tl:Sr:Ca:Cu=1:2:1:2. After intimately mixed with an agate morter and pestle, the resultant powder was molded under pressure into a disk of 20 mm in diameter and 2 mm in thickness, the produced disks were placed in an alumina crucible with a lid and fired at 880° C. for 5 hours in air, followed by annealing at 400° C. in an atmosphere of flowing argon gas for 50 hours. The resulting sintered disks were subjected to X-ray powder diffraction measurement, the results of which were analyzed by Rietveld method. As a result, it was confirmed that there were contained not less than 90% of a superconducting material having a crystalline structure consisting of one Tl, Pb or Bi atom, two Sr or Ba atoms, three Ca atoms, four Cu atoms, and five O (oxygen) atoms as shown in FIG. 1. The sintered disks were evaluated for superconducting critical temperature by a DC four terminal method, and as a result, the electric resistance was confirmed to become zero at 80 K.

Another sort of superconducting material according to the Composition 2 with n=2, i.e., the Composition 4 was prepared:

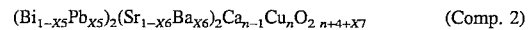
$$(Bi_{1-X5}Pb_{X5})_2(Sr_{1-X6}Ba_{X6})_2Ca_{n-1}Cu_nO_{2n+4+X7} \quad \text{(Comp. 2)}$$

where n=1, 2, or 3, $0 \leq X5 \leq 0.8$ $0 \leq X6 \leq 0.2$ $-0.5 \leq X7 \leq 0.5$;

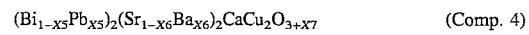
$$(Bi_{1-X5}Pb_{X5})_2(Sr_{1-X6}Ba_{X6})_2CaCu_2O_{3+X7} \quad \text{(Comp. 4)}$$

where $0 \leq X5 \leq 0.8$ $0 \leq X6 \leq 0.2$ $-0.5 \leq X7 \leq 0.5$.

Figure 5:
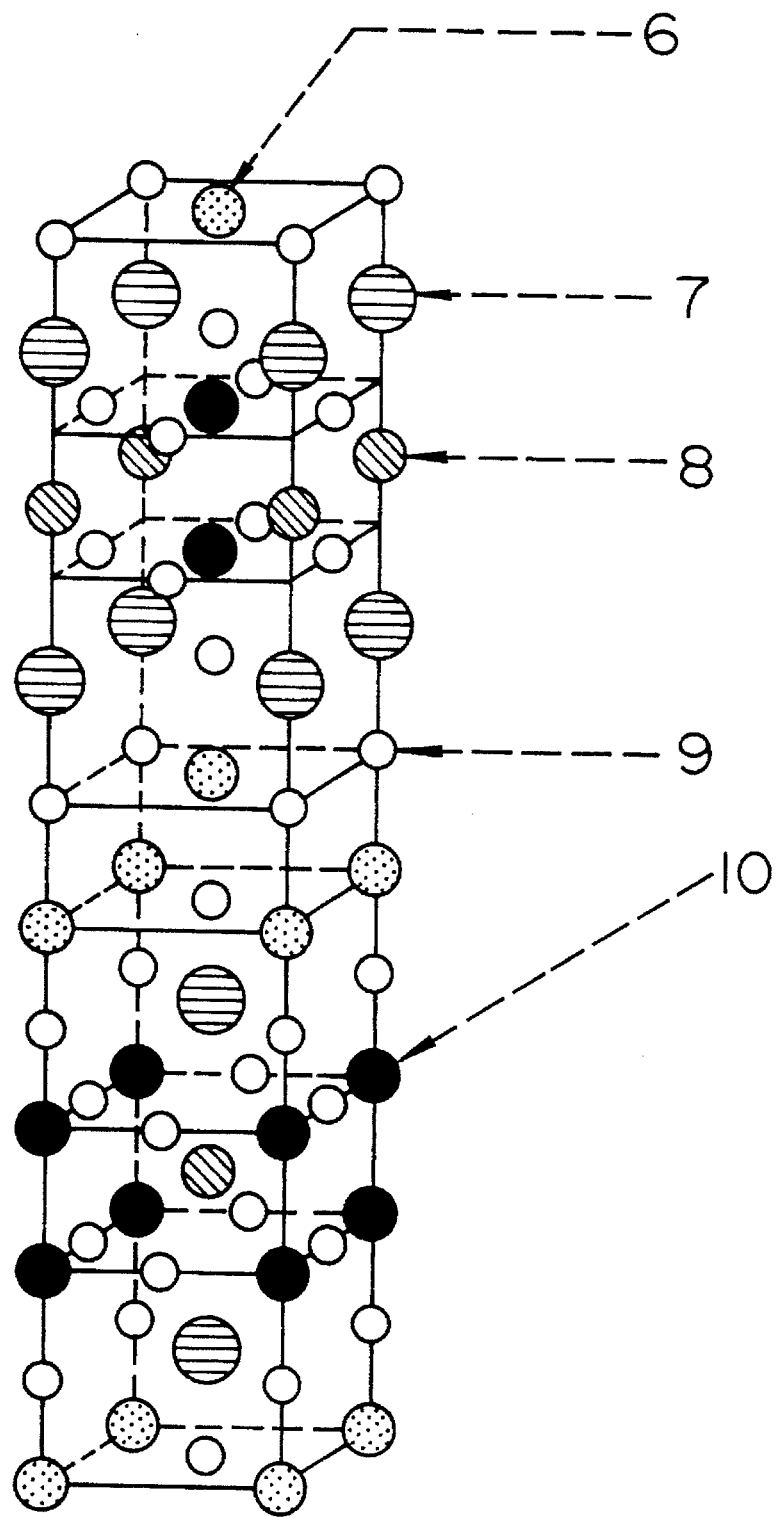
FIG. 5 shows the crystalline structure of the material having a property of growing in the form of plate crystal obtained in Example 5 according to the present invention.

The conditions of X5=0, X6=0, and X7 in the range of not zero were employed where X7 is a factor having no influence on the mechanical properties and crystalline structure of the superconducting material. SrO, CaO and CuO were mixed to achieve an atomic ratio of Sr:Ca:Cu=2:1:2, and fired at 900° C. for 20 hours in air. This powder was ground with an agate morter and pestle, and to the resultant powder, $Bi_2O_3$ was added to achieve an atomic ratio of Bi:Sr:Ca:Cu= 2:2:1:2. After intimately mixed with an agate morter and pestle, the resultant powder was molded under pressure into a disk of 20 mm in diameter and 2 mm in thickness, the produced disks were placed in an alumina crucible with a lid and fired at 830° C. for 20 hours in air, followed by annealing at 400° C. in an atmosphere of flowing argon gas for 50 hours. The resulting sintered disks were subjected to X-ray powder diffraction analysis, the results of which were analyzed by Rietveld method. As a result, it was confirmed that the sintered disks contained not less than 90% of a superconducting material having a crystalline structure as shown in FIG. 5. The sintered disks were evaluated for superconducting critical temperature by the DC four terminal method, and as a result, the electric resistance was confirmed to become zero at 93 K.

These two types of superconducting material, $TlSr_2CaCu_2O_7$ and $Bi_2Sr_2CaCu_2O_8$ were weighed in powdery state in an amount of 0.5 mol for each, mixed, molded under pressure into a disk having a diameter of 20 mm and a thickness of 2 mm, placed in an alumina crucible with a lid and fired at 840° C. in air for 20 hours. After the sintering, the sintered material was pressed and refired at 840° C. in air for 20 hours. This cycle was repeated three times and when the total firing time reached 100 hours the sintered material was annealed at 400° C. for 50 hours in an atmosphere of flowing argon gas. The sample was cut into a square rod of 20 mm×1 mm×1 mm and evaluated for superconducting critical current density (Jc) by the DC four terminal method. When a magnetic fild of zero, 0.01 T, 0.1 T, 1 T, and 5 T was applied to the sample perpendicularly to the longitudinal direction thereof at 77 K., the current density, Jc, was 10000, 9000, 8500, 8000, 7700 A/cm², respectively.

For comparison, only a powder of the $TlSr_2CaCu_2O_7$ prepared was molded under pressure into a disk having a diameter of 20 mm and a thickness of 2 mm, placed in an alumina crucible with a lid and fired at 840° C. in air for 100 hours. After the firing, the sintered disks were annealed at 400° C. for 50 hours in an atmosphere of flowing argon gas. The sample after the sintering was cut into a square rod of 20 mm×1 mm×1 mm and evaluated for Jc by the DC four terminal method. When a magnetic fild of zero, 0.01 T, 0.1 T, 1 T, and 5 T was applied to the sample perpendicularly to the longitudinal direction thereof at 77 K., the Jc was 5000, 900, 500, 500, 500 A/cm², respectively.

The rod sample was evaluated for internal texture by a scanning electron microscope (SEM) and a X-ray diffraction apparatus. It was observed that there have been formed subgrains of dimensions of approximately 50 µm×50 µm×10 µm consisting of about 10 to 20 repeating units, which unit was a laminate comprising a plate crystalline $Bi_2Sr_2CaCu_2O_8$ particle of dimensions of approximately 50 µm×50 µm×0.5 µm having another type of superconducting material, $TlSr_2CaCu_2O_7$, in the form of a crystal particle of dimensions of approximately 20 µm×20 µm×0.5 µm grown on the surface thereof in a manner as the c axes of both crystalline particles being parallel to each other. Moreover, X-ray diffraction measurement for determining a distribution of the directions, to which the c axes of the crystals are oriented, indicated that 80% or more of the crystals have the c axis oriented perpendicularly to the longitudinal direction of the cut sample, i.e., parallelly to the direction, to which the press pressure was applied. On the other hand, SEM observation of the internal texture of the sintered body consisting of only $TlSr_2CaCu_2O_7$ prepared for comparison showed that the superconducting material, $TlSr_2CaCu_2O_7$, comprises crystalline particles of dimensions of approximately 5 µm×5 µm×1 µm. X-ray diffraction measurement for determining a distribution of the directions, to which the c axes of the crystals are oriented, indicated that the c axes of the crystals were oriented at random.

From the foregoing, the following can be concluded:

(1) The $TlSr_2CaCu_2O_7$ grows plainly along the surface of the $Bi_2Sr_2CaCu_2O_8$ crystal which has a property of growing in the form of plate crystal.

(2) The $TlSr_2CaCu_2O_7$ crystals are oriented to some extent in association with the growth of the $Bi_2Sr_2CaCu_2O_8$ crystals since the latter crystals have a property of growing flatly under a uniaxial pressure as given by a press are oriented in the same direction to some extent.

(3) The orientation of the $TlSr_2CaCu_2O_7$ crystals in the same direction results in a great increase in the Jc value in the magnetic field.

EXAMPLE 2

As starting materials, $Tl_2O_3$, $Bi_2O_3$, SrO, CaO, CuO, PbO, and BaO which have a purity of no less than 99% were used at first according to the Composition 1 with n=3 to produce a superconducting material of the Composition 5:

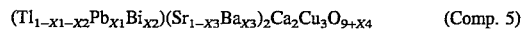

$$(Tl_{1-X1-X2}Pb_{X1}Bi_{X2})(Sr_{1-X3}Ba_{X3})_2Ca_2Cu_3O_{9+X4} \quad \text{(Comp. 5)}$$

where $0 \leq X1 \leq 0.8$ $0 \leq X2 \leq 0.5$ $0 \leq X1+X2 \leq 1$, $-0 \leq X3 \leq 1$, $-0.5 \leq X4 \leq 0.5$, The conditions of X1=0, X2=0, X3=0, and X4 in the range of not zero were employed where X4 is a factor having no influence on the mechanical properties and crystalline structure of the superconducting material. SrO, CaO and CuO were mixed to achieve an atomic ratio of Sr:Ca:Cu=2:2:3, and fired at 900° C. for 20 hours in air. This powder was ground with an agate morter and pestle, and to the resultant powder, $Tl_2O_3$ was added to achieve an atomic ratio of Tl:Sr:Ca:Cu=1:2:2:3. After intimately mixing with an agate morter and pestle, the resultant powder was molded under pressure into a disk of 20 mm in diameter and 2 mm in thickness, the produced disks were placed in an alumina crucible with a lid and fired at 880° C. for 5 hours in air, followed by annealing at 400° C. in an atmosphere of flowing argon gas for 50 hours. The resulting sintered disks were subjected to X-ray powder diffraction analysis, the results of which were analyzed by Rietveld method. As a result, it was confirmed that there were contained not less than 90% of a superconducting material having a crystalline structure as shown in FIG. 2. The sintered body was evaluated for superconducting critical temperature by the DC four terminal method, and as a result, the electric resistance was confirmed to become zero at 100 K.

Another type of superconducting material according to the Composition 2 with n=2, i.e., the Composition 6 was prepared:

$$(Bi_{1-X5}Pb_{X5})_2(Sr_{1-X6}Ba_{X6})_2CaCu_2O_{8+X7} \quad \text{(Comp. 6)}$$

where $0 \leq X5 \leq 0.8$ $0 \leq X6 \leq 0.2$ $-0.5 \leq X7 \leq 0.5$.

The conditions of X5=0, X6=0, and X7 in the range of not zero were employed where X7 is a factor having no influence on the mechanical properties and crystalline structure of the superconducting material. SrO, CaO and CuO were mixed to achieve an atomic ratio of Sr:Ca:Cu=2:1:2, and fired at 900° C. for 20 hours in air. This powder was ground with an agate morter and pestle, and to the resultant powder, $Bi_2O_3$ was added to achieve an atomic ratio of Bi:Sr:Ca:Cu= 2:2:1:2. After intimately mixing with an agate morter and pestle, the resultant powder was molded under pressure into a disk of 20 mm in diameter and 2 mm in thickness, the produced disks were placed in an alumina crucible with a lid and fired at 830° C. for 20 hours in air, followed by annealing at 400° C. in an atmosphere of flowing argon gas for 50 hours. The resulting sintered disks were subjected to X-ray powder diffraction measurement, the results of which were analyzed by Rietveld method. As a result, it was confirmed that the sintered disks contained not less than 90% of a superconducting material having a crystalline structure as shown in FIG. 5. The sintered body was evaluated for superconducting critical temperature by the DC four terminal method, and as a result, the electric resistance was confirmed to become zero at 93 K.

These two types of superconducting material, $TlSr_2Ca_2Cu_3O_9$ and $Bi_2Sr_2CaCu_2O_8$ were weighed in powdery state in an amount of 0.5 mol for each, mixed, molded under pressure into a disk having a diameter of 20 mm and a thickness of 2 mm, placed in an alumina crucible with a lid and fired at 840° C. in air for 20 hours. After the sintering, the sintered material was pressed and refired at 840° C. in air for 20 hours. This cycle was repeated three times and when the total firing time reached 100 hours the sintered material was annealed at 400° C. for 50 hours in an atmosphere of flowing argon gas. The sample was cut into a square rod of 20 mm×1 mm×1 mm and evaluated for superconducting critical current density (Jc) by the DC four terminal method. When a magnetic fild of zero, 0.01 T, 0.1 T, 1 T, and 5 T was applied to the sample perpendicularly to the longitudinal direction thereof at 77 K., the current density, Jc, was 19000, 13000, 11000, 10000, 9500 A/cm², respectively.

For comparison, only a powder of the $TlSr_2Ca_2Cu_3O_9$ prepared was molded under pressure into a disk having a diameter of 20 mm and a thickness of 2 mm, placed in an alumina crucible with a lid and fired at 840° C. in air for 100 hours. After the firing, the sintered disks were annealed at 400° C. for 50 hours in an atmosphere of flowing argon gas. The sample after the sintering was cut into a square rod of 20 mm×1 mm×1 mm and evaluated for superconducting critical current density (Jc) by the DC four terminal method. When a magnetic fild of zero, 0.01 T, 0.1 T, 1 T, and 5 T was applied to the sample perpendicularly to the longitudinal direction thereof at 77 K., the Jc was 9000, 1100, 1000, 900, 900 A/cm², respectively.

The sample was evaluated for internal texture by a scanning electron microscope (SEM) and a X-ray diffraction apparatus. It was observed that there have been formed subgrains of dimensions of approximately 50 µm×50 µm× 10 µm consisting of about 10 to 20 repeating units, which unit was a laminate comprising a plate crystalline $Bi_2Sr_2CaCu_2O_8$ particle of dimensions of approximately 50 µm ×50 µm×0.5 µm having another type of superconducting material, $TlSr_2Ca_2Cu_3O_9$, in the form of a crystal particle of dimensions of approximately 20 µm×20 µm×0.5 µm grown on the surface thereof in a manner as the c axes of both crystalline particles being parallel to each other. Moreover, X-ray diffraction measurement for determining a distribution of the directions, to which the c axes of the crystals are oriented, indicated that 80% or more of the crystals have the c axis oriented perpendicularly to the longitudinal direction of the cut sample, i.e., parallelly to the direction, to which the press pressure was applied.

On the other hand, SEM observation of the internal texture of the sintered body consisting of only $TlSr_2Ca_2Cu_3O_9$ prepared for comparison showed that the superconducting material, $TlSr_2Ca_2Cu_3O_9$, comprises crystalline particles of dimensions of approximately 5 µm x 5 µm×1 µm. X-ray diffraction measurement for determining a distribution of the directions, to which the c axes of the crystals are oriented, indicated that the c axes of the crystals were oriented at random.

EXAMPLE 3

As starting materials, $Tl_2O_3$, $Bi_2O_3$, SrO, CaO, CuO, PbO, and BaO which have a purity of no less than 99% were used at first according to the Composition 1 with n=4 to produce a superconducting material of the Composition 7:

$$(Tl_{1-X1-X2}Pb_{X1}Bi_{X2})(Sr_{1-X3}Ba_{X3})_2Ca_3Cu_4O_{11+X4} \quad \text{(Comp. 7)}$$

where $0 \leq X1 \leq 0.8$ $0 \leq X2 \leq 0.5$ $0 \leq X1+X2 \leq 1$, $0 \leq X3 \leq 1$, $-0.5 \leq X4 \leq 0.5$, The conditions of X1=0, X2=0, X3=0, and X4 in the range of not zero were employed where X4 is a factor having no influence on the mechanical properties and crystalline structure of the superconducting material. SrO, CaO and CuO were mixed to achieve an atomic ratio of Sr:Ca:Cu=2:3:4, and fired at 900° C. for 20 hours in air. This powder was ground with an agate morter and pestle, and to the resultant powder, $Tl_2O_3$ was added to achieve an atomic ratio of Tl:Sr:Ca:Cu=1:2:3:4. After intimately mixing with an agate morter and pestle, the resultant powder was molded under pressure into a disk of 20 mm in diameter and 2 mm in thickness, the produced disks were placed in an alumina crucible with a lid and fired at 880° C. for 5 hours in air, followed by annealing at 400° C. in an atmosphere of flowing argon gas for 50 hours. The resulting sintered disks were subjected to X-ray powder diffraction measurement, the results of which were analyzed by Rietveld method. As a result, it was confirmed that there were contained not less than 90% of a superconducting material having a crystalline structure as shown in FIG. 3. The sintered body was evaluated for superconducting critical temperature by the DC four terminal method, and as a result, the electric resistance was confirmed to become zero at 103 K.

Another type of superconducting material according to the Composition 2 with n=2, i.e., the Composition 6 was prepared:

$(Bi_{1-X5}Pb_{X5})_2(Sr_{1-X6}Ba_{X6})_2CaCu_2O_{8+X7}$ (Comp. 8)

where $0 \leq X5 \leq 0.8$ $0 \leq X6 \leq 0.2$ $-0.5 \leq X7 \leq 0.5$.

The conditions of X5=0, X6=0, and X7 in the range of not zero were employed where X7 is a factor having no influence on the mechanical properties and crystalline structure of the superconducting material. SrO, CaO and CuO were mixed to achieve an atomic ratio of Sr:Ca:Cu=2:1:2, and fired at 900° C. for 20 hours in air. This powder was ground with an agate morter and pestle, and to the resultant powder, $Bi_2O_3$ was added to achieve an atomic ratio of Bi:Sr:Ca:Cu= 2:2:1:2. After intimately mixing with an agate morter and pestle, the resultant powder was molded under pressure into a disk of 20 mm in diameter and 2 mm in thickness, the produced disks were placed in an alumina crucible with a lid and fired at 830° C. for 20 hours in air, followed by annealing at 400° C. in an atmosphere of flowing argon gas for 50 hours. The resulting sintered disks were subjected to X-ray powder diffraction measurement, the results of which were analyzed by Rietveld method. As a result, it was confirmed that the sintered disks contained not less than 90% of a superconducting material having a crystalline structure as shown in FIG. 5. The sintered body was evaluated for superconducting critical temperature by the DC four terminal method, and as a result, the electric resistance was confirmed to become zero at 93 K.

These two types of superconducting material, $TlSr_2Ca_3Cu_4O_{11}$ and $Bi_2Sr_2CaCu_2O_8$ were weighed in powdery state in an amount of 0.5 mol for each, mixed, molded under pressure into a disk having a diameter of 20 mm and a thickness of 2 mm, placed in an alumina crucible with a lid and fired at 840° C. in air for 20 hours. After the sintering, the sintered material was pressed and refired at 840° C. in air for 20 hours. This cycle was repeated three times and when the total firing time reached 100 hours the sintered material was annealed at 400° C. for 50 hours in an atmosphere of flowing argon gas. The sample was cut into a square rod of 20 mm×1 mm×1 mm and evaluated for superconducting critical current density (Jc) by the DC four terminal method. When a magnetic fild of zero, 0.01 T, 0.1 T, 1 T, and 5 T was applied to the sample perpendicularly to the longitudinal direction thereof at 77 K., the Jc was 20000, 15000, 12000, 10000, 9000 A/cm², respectively.

For comparison, only a powder of the $TlSr_2Ca_3Cu_4O_{11}$ prepared was molded under pressure into a disk having a diameter of 20 mm and a thickness of 2 mm, placed in an alumina crucible with a lid and fired at 840° C. in air for 100 hours. After the firing, the sintered disks were annealed at 400° C. for 50 hours in an atmosphere of flowing argon gas. The sample after the sintering was cut into a square rod of 20 mm×1 mm×1 mm and evaluated for superconducting critical current density (Jc) by the DC four terminal method. When a magnetic fild of zero, 0.01 T, 0.1 T, 1 T, and 5 T was applied to the sample perpendicularly to the longitudinal direction thereof at 77 K., the Jc was 8000, 1000, 900, 800, 700 A/cm², respectively.

The sample was evaluated for internal texture by a scanning electron microscope (SEM) and a X-ray diffraction apparatus. It was observed that there have been formed subgrains of dimensions of approximately 50 μm×50 μm×10 μm consisting of about 10 to 20 repeating units, which unit was a laminate comprising a plate crystalline $Bi_2Sr_2CaCu_2O_8$ particle of dimensions of approximately 50 μm ×50 μm×0.5 μm having another type of superconducting material, $TlSr_2Ca_3Cu_4O_{11}$, in the form of a crystal particle of dimensions of approximately 20 μm×20 μm×0.5 μm grown on the surface thereof in a manner as the c axes of both crystalline particles being parallel to each other. Moreover, X-ray diffraction measurement for determining a distribution of the directions, to which the c axes of the crystals are oriented, indicated that 80% or more of the crystals have the c axis oriented perpendicularly to the longitudinal direction of the cut sample, i.e., parallelly to the direction, to which the press pressure was applied.

On the other hand, SEM observation of the internal texture of the sintered body consisting of only $TlSr_2Ca_3Cu_4O_{11}$ prepared for comparison showed that the superconducting material, $TlSr_2Ca_3Cu_4O_{11}$, comprises crystalline particles of dimensions of approximately 5 μm×5 μm×1 μm. X-ray diffraction measurement for determining a distribution of the directions, to which the c axes of the crystals are oriented, indicated that the c axes of the crystals were oriented at random.

EXAMPLE 4

Figure 6:
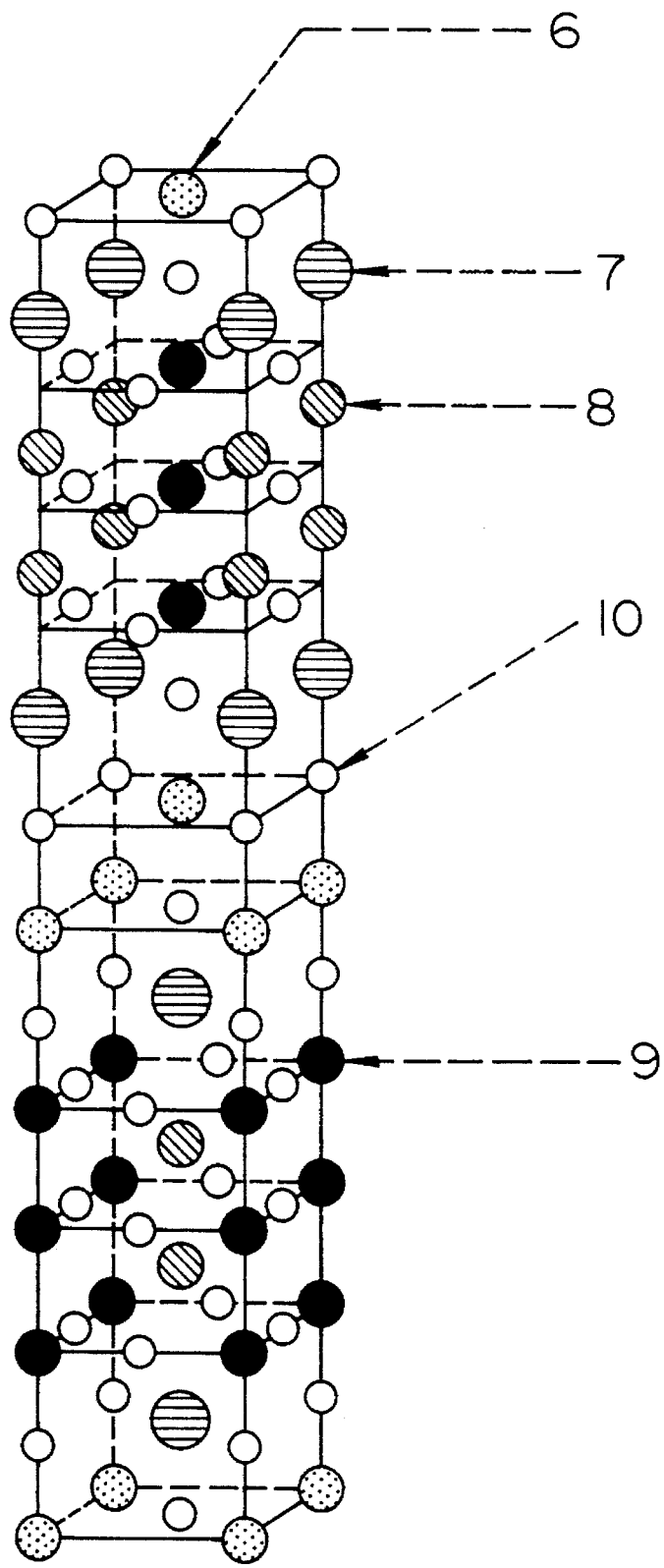
FIG. 6 shows the crystalline structure obtained in Example 4 according to the present invention.

Examples 1, 2 and 3 were repeated, except that the material of the Composition 9 having the crystalline structure as shown in FIG. 6 was used instead of $Bi_2Sr_2CaCu_2O_8$, to achieve the same results as those in Examples 1, 2 and 3.

$(B_{0.85}Pb_{0.15})_2Sr_2Ca_2Cu_3O_{10+X7}$ (Comp. 2)

Figure 4:
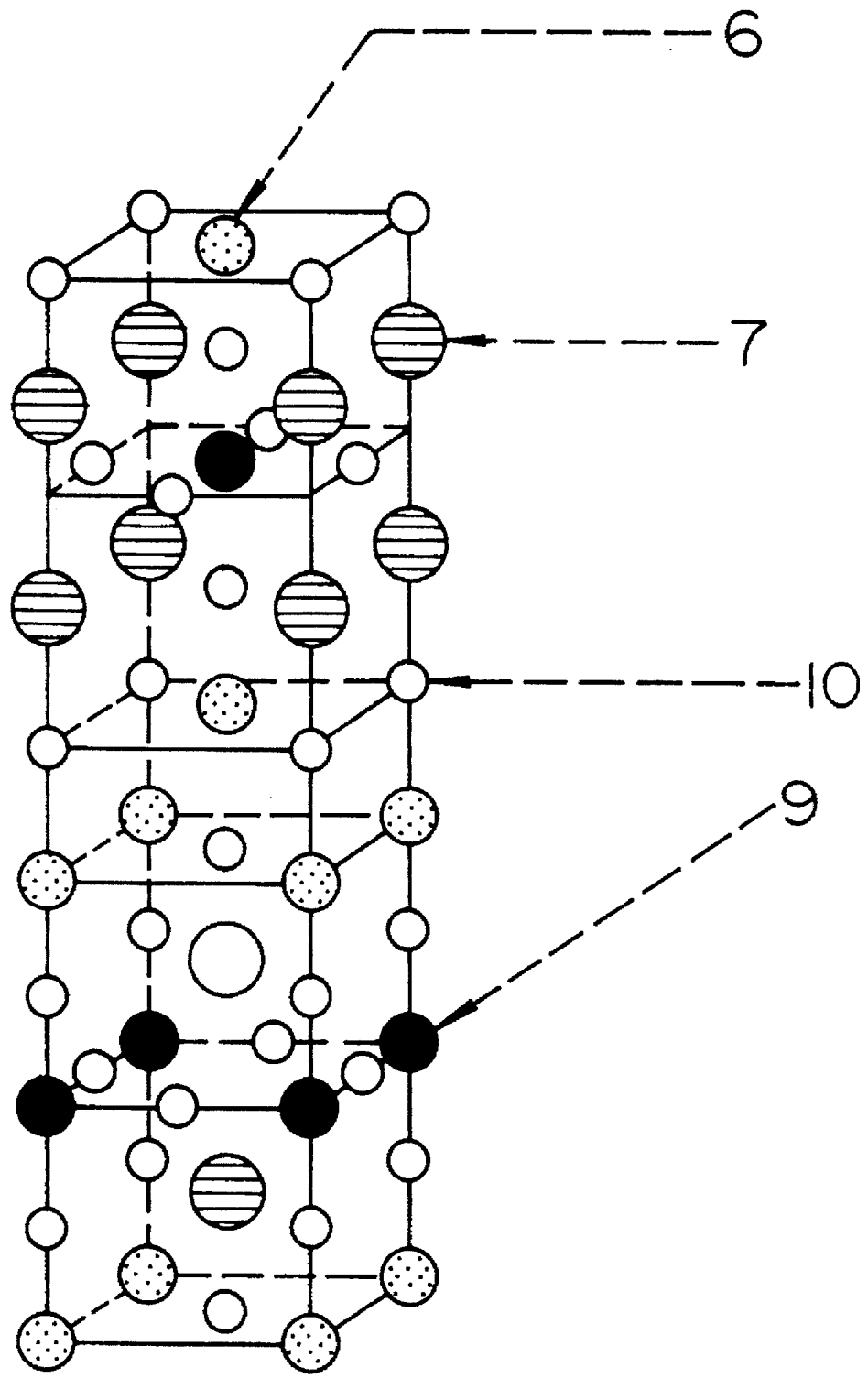
FIG. 4 shows the crystalline structure of the material having a property of growing in the form of plate crystal obtained in Example 4 according to the present invention.

Alternatively, the use of $Bi_2Sr_2CuO_6$ having the crystalline structure as shown in FIG. 4 achieved the identical results. In FIGS. 4 to 6, 6 designates Bi atom or Pb atom, 7 does Sn atom or Ba atom, 8 does Ca atom, 9 does Cu atom, and 10 does oxygen atom.

EXAMPLE 5

The procedure of Example 1 was followed, except that the $TlSr_2CaCu_2O_7$ was replaced by the superconducting material according to the Composition 3 with the substitution ratios of Pb, Bi and Ba, i.e., the values of X1, X2 and X3, being varied, to prepare samples for comparison with the samples of the present invention. The Jc values for both when a magnetic of 1 T was applied at 77 K., are indicated in Tables 1 and 2.

TABLE 1

| X1 | X2 | X3 | Samples of Present Invention | Comparative Examples |
|---|---|---|---|---|
| 0 | 0 | 0.1 | 9200 A/cm² | 600 A/cm² |
| 0 | 0 | 0.3 | 9600 A/cm² | 700 A/cm² |
| 0 | 0 | 0.5 | 9900 A/cm² | 700 A/cm² |
| 0 | 0 | 0.7 | 9000 A/cm² | 600 A/cm² |
| 0 | 0 | 1.0 | 8800 A/cm² | 800 A/cm² |
| 0 | 0.1 | 0 | 10200 A/cm² | 900 A/cm² |
| 0 | 0.2 | 0 | 10100 A/cm² | 900 A/cm² |
| 0 | 0.3 | 0 | 10500 A/cm² | 800 A/cm² |
| 0 | 0.4 | 0 | 9100 A/cm² | 700 A/cm² |
| 0.1 | 0 | 0 | 11000 A/cm² | 900 A/cm² |
| 0.3 | 0 | 0 | 19000 A/cm² | 900 A/cm² |
| 0.5 | 0 | 0 | 21000 A/cm² | 1000 A/cm² |
| 0.7 | 0 | 0 | 9500 A/cm² | 500 A/cm² |
| 0.2 | 0 | 0.1 | 11500 A/cm² | 600 A/cm² |
| 0.5 | 0 | 0.1 | 13000 A/cm² | 900 A/cm² |
| 0.3 | 0.2 | 0.1 | 16000 A/cm² | 900 A/cm² |
| 0.2 | 0 | 0.2 | 21000 A/cm² | 1300 A/cm² |
| 0.5 | 0 | 0.2 | 25000 A/cm² | 1200 A/cm² |
| 0.3 | 0.1 | 0.2 | 19000 A/cm² | 1100 A/cm² |

TABLE 2

| X1 | X2 | X3 | Samples of Present Invention | Comparative Examples |
|---|---|---|---|---|
| 0.2 | 0 | 0.3 | 16000 A/cm$^2$ | 900 A/cm$^2$ |
| 0.5 | 0 | 0.3 | 14000 A/cm$^2$ | 900 A/cm$^2$ |
| 0.2 | 0.2 | 0.3 | 11000 A/cm$^2$ | 700 A/cm$^2$ |
| 0.2 | 0 | 0.4 | 15000 A/cm$^2$ | 800 A/cm$^2$ |
| 0.5 | 0 | 0.4 | 13000 A/cm$^2$ | 700 A/cm$^2$ |
| 0.2 | 0.2 | 0.4 | 12000 A/cm$^2$ | 600 A/cm$^2$ |
| 0.3 | 0 | 0.5 | 16000 A/cm$^2$ | 900 A/cm$^2$ |
| 0.5 | 0 | 0.5 | 18000 A/cm$^2$ | 900 A/cm$^2$ |
| 0.2 | 0.1 | 0.5 | 19000 A/cm$^2$ | 1100 A/cm$^2$ |
| 0.3 | 0 | 0.6 | 9200 A/cm$^2$ | 600 A/cm$^2$ |
| 0.5 | 0 | 0.6 | 9600 A/cm$^2$ | 600 A/cm$^2$ |
| 0.2 | 0 | 0.7 | 9900 A/cm$^2$ | 500 A/cm$^2$ |
| 0.5 | 0 | 0.7 | 8200 A/cm$^2$ | 400 A/cm$^2$ |
| 0.3 | 0 | 0.8 | 8100 A/cm$^2$ | 400 A/cm$^2$ |
| 0.5 | 0 | 0.8 | 8000 A/cm$^2$ | 400 A/cm$^2$ |
| 0.1 | 0 | 1.0 | 18000 A/cm$^2$ | 1000 A/cm$^2$ |

EXAMPLE 6

The procedure of Example 2 was followed, except that the TlSr$_2$Ca$_2$Cu$_3$O$_9$ was replaced by the superconducting material according to the Composition 5 with the substitution ratios of Pb, Bi and Ba, i.e., the values of X1, X2 and X3, being varied, to prepare samples for comparison with those of the present invention. The Jc values for both when a magnetic field of 1 T was applied at

TABLE 3

| X1 | X2 | X3 | Samples of Present Invention | Comparative Examples |
|---|---|---|---|---|
| 0 | 0 | 0.1 | 11200 A/cm$^2$ | 800 A/cm$^2$ |
| 0 | 0 | 0.3 | 11600 A/cm$^2$ | 900 A/cm$^2$ |
| 0 | 0 | 0.5 | 11900 A/cm$^2$ | 900 A/cm$^2$ |
| 0 | 0 | 0.7 | 11000 A/cm$^2$ | 800 A/cm$^2$ |
| 0 | 0 | 1.0 | 10800 A/cm$^2$ | 1000 A/cm$^2$ |
| 0 | 0.1 | 0 | 12200 A/cm$^2$ | 1100 A/cm$^2$ |
| 0 | 0.2 | 0 | 12100 A/cm$^2$ | 1100 A/cm$^2$ |
| 0 | 0.3 | 0 | 13000 A/cm$^2$ | 1000 A/cm$^2$ |
| 0 | 0.4 | 0 | 11100 A/cm$^2$ | 900 A/cm$^2$ |
| 0.1 | 0 | 0 | 13000 A/cm$^2$ | 1100 A/cm$^2$ |
| 0.3 | 0 | 0 | 21000 A/cm$^2$ | 1100 A/cm$^2$ |
| 0.5 | 0 | 0 | 24000 A/cm$^2$ | 1200 A/cm$^2$ |
| 0.7 | 0 | 0 | 11000 A/cm$^2$ | 700 A/cm$^2$ |
| 0.2 | 0 | 0.1 | 13000 A/cm$^2$ | 800 A/cm$^2$ |
| 0.5 | 0 | 0.1 | 15000 A/cm$^2$ | 1100 A/cm$^2$ |
| 0.3 | 0.2 | 0.1 | 18000 A/cm$^2$ | 1100 A/cm$^2$ |
| 0.2 | 0 | 0.2 | 24000 A/cm$^2$ | 1500 A/cm$^2$ |
| 0.5 | 0 | 0.2 | 29000 A/cm$^2$ | 1400 A/cm$^2$ |

TABLE 4

| X1 | X2 | X3 | Samples of Present Invention | Comparative Examples |
|---|---|---|---|---|
| 0.3 | 0.1 | 0.2 | 21000 A/cm$^2$ | 1300 A/cm$^2$ |
| 0.2 | 0 | 0.3 | 18000 A/cm$^2$ | 1100 A/cm$^2$ |
| 0.5 | 0 | 0.3 | 16000 A/cm$^2$ | 1100 A/cm$^2$ |
| 0.2 | 0.2 | 0.3 | 13000 A/cm$^2$ | 900 A/cm$^2$ |
| 0.2 | 0 | 0.4 | 18000 A/cm$^2$ | 1000 A/cm$^2$ |
| 0.5 | 0 | 0.4 | 15000 A/cm$^2$ | 900 A/cm$^2$ |
| 0.2 | 0.2 | 0.4 | 14000 A/cm$^2$ | 800 A/cm$^2$ |
| 0.3 | 0 | 0.5 | 17000 A/cm$^2$ | 1100 A/cm$^2$ |
| 0.5 | 0 | 0.5 | 19000 A/cm$^2$ | 1100 A/cm$^2$ |
| 0.2 | 0.1 | 0.5 | 21000 A/cm$^2$ | 1300 A/cm$^2$ |
| 0.3 | 0 | 0.6 | 11000 A/cm$^2$ | 800 A/cm$^2$ |
| 0.5 | 0 | 0.6 | 12000 A/cm$^2$ | 800 A/cm$^2$ |
| 0.2 | 0 | 0.7 | 12000 A/cm$^2$ | 700 A/cm$^2$ |
| 0.5 | 0 | 0.7 | 10000 A/cm$^2$ | 600 A/cm$^2$ |
| 0.3 | 0 | 0.8 | 10000 A/cm$^2$ | 600 A/cm$^2$ |
| 0.5 | 0 | 0.8 | 10000 A/cm$^2$ | 600 A/cm$^2$ |
| 0.1 | 0 | 1.0 | 21000 A/cm$^2$ | 1200 A/cm$^2$ |

EXAMPLE 7

The procedure of Example 3 was followed, except that the TlSr$_2$Ca$_3$Cu$_4$O$_{11}$ was replaced by the superconducting material according to the Composition 7 with the substitution ratios of Pb, Bi and Ba, i.e., the values of X1, X2 and X3, being varied, to prepare samples for comparison with those of the present invention. The Jc values for both when a magnetic field of 1 T was applied at 77 K., are indicated in Tables 5 and 6.

TABLE 5

| X1 | X2 | X3 | Samples of Present Invention | Comparative Examples |
|---|---|---|---|---|
| 0 | 0 | 0.1 | 10000 A/cm$^2$ | 700 A/cm$^2$ |
| 0 | 0 | 0.3 | 10600 A/cm$^2$ | 800 A/cm$^2$ |
| 0 | 0 | 0.5 | 10800 A/cm$^2$ | 800 A/cm$^2$ |
| 0 | 0 | 0.7 | 10100 A/cm$^2$ | 700 A/cm$^2$ |
| 0 | 0 | 1.0 | 10000 A/cm$^2$ | 1000 A/cm$^2$ |
| 0 | 0.1 | 0 | 11100 A/cm$^2$ | 1000 A/cm$^2$ |
| 0 | 0.2 | 0 | 11100 A/cm$^2$ | 1000 A/cm$^2$ |
| 0 | 0.3 | 0 | 12300 A/cm$^2$ | 800 A/cm$^2$ |
| 0 | 0.4 | 0 | 12100 A/cm$^2$ | 800 A/cm$^2$ |
| 0.1 | 0 | 0 | 13000 A/cm$^2$ | 1200 A/cm$^2$ |
| 0.3 | 0 | 0 | 20000 A/cm$^2$ | 1000 A/cm$^2$ |
| 0.5 | 0 | 0 | 22000 A/cm$^2$ | 1100 A/cm$^2$ |
| 0.7 | 0 | 0 | 12000 A/cm$^2$ | 600 A/cm$^2$ |
| 0.2 | 0 | 0.1 | 11000 A/cm$^2$ | 700 A/cm$^2$ |
| 0.5 | 0 | 0.1 | 14000 A/cm$^2$ | 1000 A/cm$^2$ |
| 0.3 | 0.2 | 0.1 | 16000 A/cm$^2$ | 1000 A/cm$^2$ |
| 0.2 | 0 | 0.2 | 20000 A/cm$^2$ | 1400 A/cm$^2$ |
| 0.5 | 0 | 0.2 | 28000 A/cm$^2$ | 1300 A/cm$^2$ |

TABLE 6

| X1 | X2 | X3 | Samples of Present Invention | Comparative Examples |
|---|---|---|---|---|
| 0.3 | 0.1 | 0.2 | 20000 A/cm$^2$ | 1200 A/cm$^2$ |
| 0.2 | 0 | 0.3 | 17000 A/cm$^2$ | 1000 A/cm$^2$ |
| 0.5 | 0 | 0.3 | 15000 A/cm$^2$ | 1000 A/cm$^2$ |
| 0.2 | 0.2 | 0.3 | 12000 A/cm$^2$ | 800 A/cm$^2$ |
| 0.2 | 0 | 0.4 | 17000 A/cm$^2$ | 900 A/cm$^2$ |
| 0.5 | 0 | 0.4 | 14000 A/cm$^2$ | 800 A/cm$^2$ |
| 0.2 | 0.2 | 0.4 | 12000 A/cm$^2$ | 700 A/cm$^2$ |
| 0.3 | 0 | 0.5 | 16000 A/cm$^2$ | 1000 A/cm$^2$ |
| 0.5 | 0 | 0.5 | 18000 A/cm$^2$ | 1000 A/cm$^2$ |
| 0.2 | 0.1 | 0.5 | 22000 A/cm$^2$ | 1100 A/cm$^2$ |
| 0.3 | 0 | 0.6 | 13000 A/cm$^2$ | 700 A/cm$^2$ |
| 0.5 | 0 | 0.6 | 11000 A/cm$^2$ | 700 A/cm$^2$ |
| 0.2 | 0 | 0.7 | 10000 A/cm$^2$ | 600 A/cm$^2$ |
| 0.5 | 0 | 0.7 | 9000 A/cm$^2$ | 500 A/cm$^2$ |
| 0.3 | 0 | 0.8 | 9000 A/cm$^2$ | 500 A/cm$^2$ |
| 0.5 | 0 | 0.8 | 8000 A/cm$^2$ | 500 A/cm$^2$ |
| 0.1 | 0 | 1.0 | 18000 A/cm$^2$ | 1000 A/cm$^2$ |

EXAMPLE 8

As starting materials, Tl$_2$O$_3$, Bi$_2$O$_3$, SrO, CaO, CuO, PbO, and BaO which have a purity of no less than 99% were used. At first a superconducting material according to the Composition 5 was prepared. SrO, BaO, CaO and CuO were mixed to achieve an atomic ratio of Sr:Ba:Ca:Cu=

1.6:0.4:2:3, and fired at 900° C. for 20 hours in air. This powder was ground with an agate morter and pestle, and to the resultant powder, $Tl_2O_3$ and PbO were added to achieve an atomic ratio of Tl:Pb:Sr:Ba:Ca:Cu=0.6:0.4:1.6:0.4:2:3. After intimately mixing with an agate morter and pestle, the resultant powder was molded under pressure into a disk of 20 mm in diameter and 2 mm in thickness, the produced disks were placed in an alumina crucible with a lid and fired at 880° C. for 5 hours in air. The resulting sintered disks were subjected to X-ray powder diffraction measurement, the results of which were analyzed by Rietveld method. As a result, it was confirmed that there were contained not less than 90% of a superconducting material having a crystalline structure as shown in FIG. 2. This sintered body was evaluated for superconducting critical temperature by the DC four terminal method, and as a result, the electric resistance was confirmed to become zero at 118 K.

Next, another type of superconducting material according to the Composition 10 was prepared:

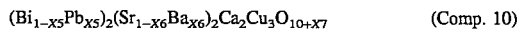

$(Bi_{1-x5}Pb_{x5})_2(Sr_{1-x6}Ba_{x6})_2Ca_2Cu_3O_{10+x7}$ (Comp. 10)

SrO, BaO, CaO and CuO were mixed to achieve an atomic ratio of Sr:Ba:Ca:Cu=1.9:0.1:2:3, and fired at 900° C. for 20 hours in air. This powder was ground with an agate morter and pestle, and to the resultant powder, $Bi_2O_3$ and PbO were added to achieve an atomic ratio of Bi:Pb:Sr:Ba:Ca:Cu=1.7:0.3:1.9:0.1:2:3. After intimately mixing with an agate morter and pestle, the resultant powder was molded under pressure into a disk of 20 mm in diameter and 2 mm in thickness, the produced disks were placed in an alumina crucible with a lid and fired at 845° C. for 100 hours in air. The resulting sintered disks were subjected to X-ray powder diffraction measurement, the results of which were analyzed by Lietbert method. As a result, it was confirmed that there were contained not less than 90% of a superconducting material having a crystalline structure as shown in FIG. 6. This sintered body was evaluated for superconducting critical temperature by the DC four terminal method, and as a result, the electric resistance was confirmed to become zero at 93 K.

These two types of superconducting material, i.e., the Composition 11 weighed 0.7 mol and the Composition 12 weighed 0.3 mol were mixed, filled in a silver pipe having an outside diameter of 6 mm and an inside diameter of 4 mm, drawn up to an outside diameter of 0.8 mm, and thereafter, rolled to a thickness of 0.1 mm.

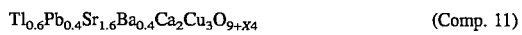

$Tl_{0.6}Pb_{0.4}Sr_{1.6}Ba_{0.4}Ca_2Cu_3O_{9+x4}$ (Comp. 11)

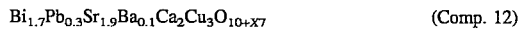

$Bi_{1.7}Pb_{0.3}Sr_{1.9}Ba_{0.1}Ca_2Cu_3O_{10+x7}$ (Comp. 12)

The resultant slab was cut into a sample of 30 mm which was heat-treated at a temperature of 845° C. in air for 20 hours, followed by cooling for 8 hours to room temperature. The heat-treated sample was pressed and fired again at a temperature of 845° C. in air for 20 hours. This cycle was repeated three times and when the total firing time reached 100 hours the sintered material was annealed at 400° C. for 50 hours in an atmosphere of flowing argon gas. The sample was evaluated for superconducting critical current density (Jc) by the DC four terminal method. When a magnetic fild of zero, 0.01 T, 0.1 T, 1 T and 5 T was applied to the sample perpendicularly to the longitudinal direction thereof at 77 K., the Jc was 59000, 50000, 45000, 32000 and 30000 A/cm$^2$, respectively.

Only a powder of the material of the Composition 11 prepared for comparison was filled in a silver pipe having an outside diameter of 6 mm and an inside diameter of 4 mm, drawn up to an outside diameter of 0.8 mm, and thereafter, rolled to a thickness of 0.1 mm. The resultant slab was cut into a sample of 30 mm which was heat-treated at a temperature of 845° C. in air for 20 hours, followed by cooling for 8 hours to room temperature. The heat-treated sample was pressed and fired again at a temperature of 845° C. in air for 20 hours. This cycle was repeated three times and when the total firing time reached 100 hours the sintered material was annealed at 400° C. for 50 hours in an atmosphere of flowing argon gas. The sample was evaluated for superconducting critical current density (Jc) by the DC four terminal method. When a magnetic fild of zero, 0.01 T, 0.1 T, 1 T and 5 T was applied to the sample perpendicularly to the longitudinal direction thereof at 77 K., the Jc was 15000, 2200, 1600, 1100 and 1000 A/cm$^2$, respectively.

The sample was evaluated for internal texture by a scanning electron microscope (SEM) and a X-ray diffraction apparatus. It was observed that there have been formed subgrains of dimensions of approximately 60 μm×60 μm×10 μm consisting of about 10 to 20 repeating units, which unit was a laminate comprising a plate crystal particle expressed by the Composition 12 of dimensions of approximately 60 μm×60 μm×0.5 μm having another type of superconducting material expressed by the Composition 11 in the form of a crystal particle of dimensions of approximately 20 μm×20 μm×0.5 μm grown on the surface thereof in a manner as the c axes of both crystal particles being parallel to each other. Moreover, X-ray diffraction measurement for determining a distribution of the directions, to which the c axes of the crystals are oriented, indicated that 80% or more of the crystals have the c axis oriented perpendicularly to the surface of the tape-like sample, i.e., parallelly to the direction, to which the press pressure was applied.

On the other hand, SEM observation of the internal texture of the sintered body consisting of only the superconducting material expressed by the Composition 11 prepared for comparison showed that the superconducting material comprises crystalline particles of dimensions of approximately 20 μm×20 μm×1 μm. X-ray diffraction measurement for determining a distribution of the directions, to which the c axes of the crystals are oriented, indicated that the c axes of the crystals were oriented at random.

From the foregoing, it can be appreciated that a superconducting material being poor in the tendency of growing in the form of plate crystal is allowed to be oriented in association with the orientation of another superconducting material having a characteristic of growing in the form of plate crystal in a manner as the specific axes of crystals being oriented in the same direction by utilizing the force in mechanical processing. It can be noted that the Jc values of the thus produced superconducting wires are very high.

Moreover, identical wires were manufactured using $Bi_2Sr_2CuO_6$, which is not superconductive at 77 K., as superconducting material having a characteristic of growing in the form of plate crystal instead of the Composition 12. The wires were evaluated for superconducting critical current density (Jc) by the DC four terminal method. When a magnetic fild of zero, 0.01 T, 0.1 T, 1 T and 5 T was applied to the sample perpendicularly to the longitudinal direction thereof at 77 K., the Jc was 48000, 43000, 32000, 21000 and 20000 A/cm$^2$, respectively.

From the foregoing, it can be understood that the superconducting materials having a high irreversible magnetic field can be oriented by utilizing the materials or superconducting materials having a characteristic of growing in the form of plate crystal to produce a superconductor having a higher Jc in the magnetic field.

EXAMPLE 9

Superconducting wires of 100 m in length were manufactured by the identical procedure to that in Example 8, except that the processing was made by means of a rolling apparatus with large diameter rolls instead of the press. After the final heat-treatment, the wires were evaluated for Jc to find having 30000 A/cm² at zero magnetic field. The measurement of Jc in the magnetic field was made by the DC four terminal method for 10 samples of 10 cm long prepared by cutting the 100 m wires into a 10 cm length at random. The measurement indicated that the samples having worst characteristics has a Jc of 33000, 26000, 23000, 21000 and 20000 A/cm² when a magnetic field of zero, 0.01 T, 0.1 T, 1 T and 5 T was applied perpendicularly to the longitudinal direction of the samples.

EXAMPLE 10

Superconducting wires of 100 m in length were manufactured by the identical procedure to that in Example 9. With the wires a superconducting coil of the solenoid type was made. The coil was immersed in liquid nitrogen and an electric current was passed across the coil to generate a magnetic field, whereby the maximum magnetic field of 2.1 tesla could be generated.

EXAMPLE 11

With the superconducting magnet made in Example 10, a NMR apparatus was constructed and could be confirmed to be applicable to the measurement of nuclear magnetic resonance of hydrogen atom. It has been found that the construction cost can be reduced by no less than 10% since the adiabatic equipment can be simplified as compared with those commercially available apparatuses of the type workable with helium coolant. In addition, it has been found that the use of expensive liquid helium is not required resulting in a great reduction in operation cost. Since the NMR apparatus and MRI apparatus are the same in basic physical principle, it can be considered possible to produce a MIR apparatus with the superconducting magnet which is manufactured using the superconducting wires comprising the superconducting materials according to the present invention. Estimating the production cost, a reduction in cost of at least 20% may be considered possible because one can use a cheaper nitrogen refrigerator having a much simpler structure in place of the helium refrigerator and only single adiabatic enclosure is required.

EXAMPLE 12

Magnetically leviated trains with the superconducting wires manufactured in accordance with the present invention were estimated for production cost. Since a cheaper nitrogen refrigerator having a much simpler structure may be used in place of the helium refrigerator, only single adiabatic enclosure is required, and the superconducting wires have a higher specific heat, it can be understood that the reliability of the magnetically leviated trains may be greately enhanced and a reduction in cost of at least 5% may be achieved.

EXAMPLE 13

Magnetic shields were manufactured using the superconductor produced according to the present invention. The superconducting slab having a thickness of 3 cm was used to produce a cube, which was cooled using a nitrogen gas at 78 K. to be in the shield superconductive state under a magnetic field of 50 gauss applied externally. The measurement of internal magnetic field by a hall element placed inside indicated that the magnetic field was on a low level of less than the detectable limit. When the external magnetic field was 3000 gauss, the internal magnetic field was about one gauss. It could be confirmed that the magnetic shields manufactured with the superconductor according to the present invention had satisfactory characteristics.

EXAMPLE 14

All the four pole electromagnets for convergence of elementary particle beams to be attached to a large scale elementary particle accelerator, for example, to an accelerator ring having a diameter of 1 km may be constructed with the magnets which are made using the superconducting wires according to the present invention. We estimated a magnitude of an reduction in cost in such case as compared with the case where conventional superconducting magnets workable with liquid helium coolant were used for the construction. As a cheaper nitrogen refrigerator having a much simpler structure may be used in place of the helium refrigerator, a better adiabatic condition can be simply achieved, and the structure of the system for supplying the coolant to the superconducting magnets may be simplified to a great extent owing to the use of liquid nitrogen having a higher specific heat, it could be noted to achieve a reduction in cost of no less than 20%

The use of the superconductors produced in accordance with the present invention enables the manufacture of superconducting magnets having better characteristics capable of working with liquid nitrogen coolant. Furthermore, the use of such magnets allows the construction of NMR, SQUID, MRI apparatuses as well as magnetically leviated trains, which are all workable with liquid nitrogen. Any one of the apparatuses using superconducting magnets can be replaced by those with the superconducting magnets comprising the superconductors according to the present invention, thereby allowing the apparatuses to work with liquid nitrogen coolant. More than only a reduction in operation cost (a difference in expense between liquid helium and liquid nitrogen), the capability of working with liquid nitrogen coolant yields benefits such as great reductions in the cost for maintaining the reliability of the superconducting apparatuses (which necessitates various expedients taken to suppress the phenomenon of sudden destruction of superconductive condition called quench), the cost for the refrigerators, and the cost for the adiabatic equipment. Therefore, the superconducting apparatuses can be lowered in their expenses by manufacturing them with the superconducting wires and coils according to the present invention.

The present invention provides a superconductor capable of working with liquid nitrogen coolant let alone with liquid helium and having a high superconducting critical current density even in a high magnetic field. The use of this superconductor enables the operation under cooling with liquid nitrogen so that the cooling systems, adiabatic structures and the expedients against the quench can be simplified allowing the provision of low cost apparatuses where superconductors are utilized.

What is claimed is:

1. A superconductor comprising a laminated structure with alternating layers of first and second superconducting materials, said layers having thicknesses of no less than 5 nm and no more than 5 μm, said first superconducting material having the chemical composition:

$$(Tl_{1-x1-x2}Pb_{x1}Bi_{x2})(Sr_{1-x3}Ba_{x3})_2Ca_{n-1}Cu_nO_{2n+3+x4}$$

where n=2, 3, 4, 5, or 6, $0 \leq X1 \leq 0.8$ $0 \leq X2 \leq 0.5$ $0 \leq X1+X2 \leq 1$, $0 \leq X3 \leq 1$, $-0.5 \leq X4 \leq 0.5$, and the second superconducting material having the chemical composition:

$$(Bi_{1-x5}Pb_{x5})_2(Sr_{1-x6}Ba_{x6})_2Ca_{n-1}Cu_nO_{2n+4+x7}$$

where n=1, 2, or 3, $0 \leq X5 \leq 0.8$ $0 \leq X6 \leq 0.2$ $-0.5 \leq X7 \leq 0.5$.

2. A superconductor comprising a laminated structure with alternating layers of first and second superconducting materials, said layers having thicknesses of no less than 5 nm and no more than 5 μm, said first superconducting material having the chemical composition:

$$(Tl_{1-x1-x2}Pb_{x1}Bi_{x2})(Sr_{1-x3}Ba_{x3})_2CaCu_2O_{7+x4}$$

where $0 \leq X1 \leq 0.8$ $0 \leq X2 \leq 0.5$ $0 \leq X1+X2 \leq 1$, $0 \leq X3 \leq 1$, $-0.5 \leq X4 \leq 0.5$, and the second superconducting material having the chemical composition:

$$(Bi_{1-x5}Pb_{x5})_2(Sr_{1-x6}Ba_{x6})_2CaCu_2O_{3+x7}$$

where $0 \leq X5 \leq 0.8$ $0 \leq X6 \leq 0.2$ $-0.5 \leq X7 \leq 0.5$.

3. A superconductor comprising a laminated structure with alternating layers of first and second superconducting materials, said layers having thicknesses of no less than 5 nm and no more than 5 μm, said first superconducting material having the chemical composition:

$$(Tl_{1-x1-x2}Pb_{x1}Bi_{x2})(Sr_{1-x3}ba_{x3})_2CaCu_3O_{9+x4}$$

where $0 \leq X1 \leq 0.8$ $0 \leq X2 \leq 0.5$ $0 \leq X1+X2 \leq 1$, $0 \leq X3 \leq 1$, $-0.5 \leq X4 \leq 0.5$, and the second superconducting material having the chemical composition:

$$(Bi_{1-x5}Pb_{x5})_2(Sr_{1-x6}Ba_{x6})_2CaCu_2O_{8+x7}$$

where $0 \leq X5 \leq 0.8$ $0 \leq X6 \leq 0.2$ $-0.5 \leq X7 \leq 0.5$.

4. A superconductor comprising a laminated structure with alternating layers of first and second superconducting materials, said layers having thicknesses of no less than 5 nm and no more than 5 μm, said first superconducting material having the chemical composition:

$$(Tl_{1-x1-x2}Pb_{x1}Bi_{x2})(Sr_{1-x3}Ba_{x32}CaCu_4O_{11+x4}$$

where $0 \leq X1 \leq 0.8$ $0 \leq X2 \leq 0.5$ $0 \leq X1+X2 \leq 1$, $0 \leq X3 \leq 1$, $-0.5 \leq X4 \leq 0.5$, and the second superconducting material having the chemical composition:

$$(Bi_{1-x5}Pb_{x5})_2(Sr_{1-x6}ba_{x6})_2CaCu_2O_{8+x7}$$

where $0 \leq X5 \leq 0.8$ $0 \leq X6 \leq 0.2$ $-0.5 \leq X7 \leq 0.5$.

5. The superconductor according to any one of claims 1 to 3, wherein the superconducting materials have the chemical composition with X3=0 and X6=0.

6. The superconductor according to any one of claims 1 to 4, wherein said superconductor comprises members each having a laminated structure of the superconducting materials alternatingly stratified on top of one another and approximately 80% of said members are laminated in the direction at an angle of 90° to the direction of passing the superconducting current.

7. The superconductor according to any one claims 1 to 4, wherein one of said superconducting materials has an irreversible magnetic field at 77 K. of higher than one tesla and the other of said superconducting materials has a irreversible magnetic field at 77 K. of less than 0.7 tesla.

* * * * *